(12) United States Patent
Wiedeman (10) Patent No.: US 10,131,998 B2
(45) Date of Patent: Nov. 20, 2018

(54) METALIZATION OF FLEXIBLE POLYMER SHEETS

(71) Applicant: Global Solar Energy, Inc., Tucson, AZ (US)

(72) Inventor: Scott Wiedeman, Tucson, AZ (US)

(73) Assignee: Global Solar Energy, Inc., Tucson, AZ (US)

( * ) Notice: Subject to any disclaimer, the term of this patent is extended or adjusted under 35 U.S.C. 154(b) by 454 days.

(21) Appl. No.: 14/873,602

(22) Filed: Oct. 2, 2015

(65) Prior Publication Data

US 2017/0096743 A1 Apr. 6, 2017

(51) Int. Cl.
| | | |
|---|---|---|
| C25D 1/20 | (2006.01) | |
| C25D 1/08 | (2006.01) | |
| H01L 31/02 | (2006.01) | |
| C25D 1/04 | (2006.01) | |
| H01L 31/0224 | (2006.01) | |
| H01L 31/18 | (2006.01) | |
| H05K 3/20 | (2006.01) | |
| H05K 1/03 | (2006.01) | |

(52) U.S. Cl.
CPC ............... *C25D 1/20* (2013.01); *C25D 1/04* (2013.01); *C25D 1/08* (2013.01); *H01L 31/02008* (2013.01); *H01L 31/022425* (2013.01); *H01L 31/18* (2013.01); *H05K 3/205* (2013.01); *H05K 1/0393* (2013.01); *H05K 2201/0108* (2013.01); *H05K 2203/0726* (2013.01); *H05K 2203/1545* (2013.01); *Y02E 10/50* (2013.01)

(58) Field of Classification Search
CPC ...... C25D 1/20; C25D 1/08; H01L 31/020008
See application file for complete search history.

(56) References Cited

U.S. PATENT DOCUMENTS

| | | |
|---|---|---|
| 3,969,199 A | 7/1976 | Berdan et al. |
| 4,169,018 A | 9/1979 | Berdan et al. |
| 5,221,458 A | 6/1993 | Herbert et al. |
| 5,233,157 A | 8/1993 | Schreiber et al. |
| 5,283,121 A * | 2/1994 | Bordner .............. B41N 7/00 428/375 |
| 5,322,975 A | 6/1994 | Nagy et al. |

(Continued)

OTHER PUBLICATIONS

D.P. Barkey, "Studies on High Speed Electroforming", Ph.D. Thesis for Lawrence Berkeley Laboratory University of California Materials & Chemical Sciences Division, Aug. 1987.

(Continued)

*Primary Examiner* — Daniel McNally
(74) *Attorney, Agent, or Firm* — Kolisch Hartwell. P.C.

(57) ABSTRACT

A conductive grid formation system, apparatus, and related methods may include a drum having a conductive surface, an insulation layer coating said surface, and a grid pattern formed in the insulation layer to expose portions of the conductive surface. The drum surface may be rotated into and out of a chemical bath, such that a metallic grid is electrodeposited in the exposed portions of the conductive surface. A polymer sheet may be laminated to the surface of the drum and then removed, such that the metallic grid attaches to the polymer sheet and is removed with the polymer sheet. Heat, pressure, and/or adhesive may be utilized in various steps of the process, to facilitate preferential adhesion of the metallic grid to the polymer sheet.

20 Claims, 5 Drawing Sheets

(56) References Cited

U.S. PATENT DOCUMENTS

| | | | |
|---|---|---|---|
| 5,863,666 | A | 1/1999 | Merchant et al. |
| 6,310,281 | B1 | 10/2001 | Wendt et al. |
| 6,372,538 | B1 | 4/2002 | Wendt et al. |
| 7,194,197 | B1 | 3/2007 | Wendt et al. |
| 8,062,922 | B2 | 11/2011 | Britt et al. |
| 8,993,364 | B2 | 3/2015 | Wiedeman et al. |
| 2006/0283539 | A1* | 12/2006 | Slafer ............... B05D 1/28 156/230 |
| 2011/0207328 | A1* | 8/2011 | Speakman ......... H01L 51/0011 438/694 |
| 2013/0269748 | A1 | 10/2013 | Wiedeman et al. |

OTHER PUBLICATIONS

Morton Schwartz, "Deposition from Aqueous Solutions: An Overview", article in Handbook of Deposition Technologies for Films and Coatings: Science, Technology and Applications Edited by Rointan F. Bunshah, pp. 506-616, 1994, Noyes Publications, U.S.A.

Michael Carano, "Electrodeposition of Copper, Parts 1, 2 and 3." article for Printed Circuit Design & Fab Magazine Online, Jul. 1, 2008, found at http://pcdandf.com/cms/magazine/95/4903 on May 2, 2011.

Mohammad Sakhawat Hussain, "Electroforming a process for macro / nano manufacturing" abstract from the International Journal of Nanomanufacturing, vol. 6, No. 1-4, 2010.

Jack W. Dini and Dexter D. Snyder, "Electrodeposition of Copper" article in Modern Electroplating, Fifth Edition, 2010, Edited by Mordechay Schlesinger and Milan Paunovic, pp. 33-78, John Wiley & Sons, Inc., U.S.A.

Dudin et al., "High rate of copper electrodeposition from the hexafluorosilicate bath", abstract from Surface and Coatings Technology, vol. 204, Issue 20, Jul. 15, 2010.

Bruce K. Gale, "Electro Chemical Deposition: Principles, Methods and Applications", presentation for University of Utah Fundamentals of Microfabrication Course, 2012, found at http://www.eng.utah.edu/~gale/mems/Lecture%2012%20Electrodeposition.pdf.

Dec. 13, 2016, International Search Report of the International Searching Authority from The U.S. Receiving Office in PCT/US2016/054814, which is the international application to this U.S. application.

Dec. 13, 2016, Written Opinion of the International Searching Authority from The U.S. Receiving Office in PCT/US2016/054814, which is the international application to this U.S. application.

\* cited by examiner

METALIZATION OF FLEXIBLE POLYMER SHEETS

CROSS-REFERENCES

The following related applications and materials are incorporated herein, in their entireties, for all purposes: U.S. Pat. No. 8,993,364 and U.S. Publication No. 2013/0269748 A1.

FIELD

This disclosure relates to systems and methods for forming conductive grid patterns on flexible polymer sheets. The grid patterns formed may, for example, be particularly suitable for use as collection grids in photovoltaic cells or modules or as low cost flexible circuits such as radio frequency identification tags (RFID tags).

INTRODUCTION

The field of photovoltaics generally relates to multi-layer materials that convert sunlight directly into DC electrical power. The basic mechanism for this conversion is the photovoltaic effect, first observed by Antoine-César Becquerel in 1839, and first correctly described by Einstein in a seminal 1905 scientific paper for which he was awarded a Nobel Prize for physics. In the United States, photovoltaic (PV) devices are popularly known as solar cells or PV cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the metallurgical junction that forms the electronic p-n junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from the junction, with the electron moving toward the electrode on the n-type side, and the hole moving toward the electrode on the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage. The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin-film" PV cell. In comparison to other types of PV cells, such as crystalline silicon PV cells, thin-film PV cells require less light-absorbing semiconductor material to create a working cell, and thus can reduce processing costs. Thin-film based PV cells also offer reduced cost by employing previously developed deposition techniques for the electrode layers, where similar materials are widely used in the thin-film industries for protective, decorative, and functional coatings. Common examples of low cost commercial thin-film products include water impermeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin-film deposition techniques.

Furthermore, thin-film cells have exhibited efficiencies exceeding 20%, which rivals or exceeds the efficiencies of the most efficient crystalline cells. In particular, the semiconductor material copper indium gallium diselenide (CIGS) is stable, has low toxicity, and is truly a thin film, requiring a thickness of less than two microns in a working PV cell. As a result, to date CIGS appears to have demonstrated the greatest potential for high performance, low cost thin-film PV products, and thus for penetrating bulk power generation markets. Other semiconductor variants for thin-film PV technology include copper indium diselenide, copper indium disulfide, copper indium aluminum diselenide, and cadmium telluride.

Some thin-film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, when comparing technology options applicable during the deposition process, rigid substrates suffer from various shortcomings during processing, such as a need for substantial floor space for processing equipment and material storage, expensive and specialized equipment for heating glass uniformly to elevated temperatures at or near the glass annealing temperature, a high potential for substrate fracture with resultant yield loss, and higher heat capacity with resultant higher electricity cost and processing time for heating the glass. Furthermore, rigid substrates require increased shipping costs due to the weight and fragile nature of the glass. As a result, the use of glass substrates for the deposition of thin films may not be the best choice for low-cost, large-volume, high-yield, commercial manufacturing of multi-layer functional thin-film materials such as photovoltaics.

In contrast, roll-to-roll processing of thin flexible substrates allows for the use of compact, less expensive vacuum systems, and of non-specialized equipment that already has been developed for other thin film industries. PV cells based on thin flexible substrate materials also exhibit a relatively high tolerance to rapid heating and cooling and to large thermal gradients (resulting in a low likelihood of fracture or failure during processing), require comparatively low shipping costs, and exhibit a greater ease of installation than cells based on rigid substrates. Additional details relating to the composition and manufacture of thin film PV cells of a type suitable for use with the presently disclosed methods and apparatus may be found, for example, in U.S. Pat. Nos. 6,310,281, 6,372,538, and 7,194,197, all to Wendt et al., and U.S. Pat. No. 8,062,922 to Britt et al, all of which are hereby incorporated by reference in their entireties.

As noted previously, a significant number of PV cells often are connected in series to achieve a usable voltage, and thus a desired power output. Such a configuration is often called a "string" of PV cells. Due to the different properties of crystalline substrates and flexible thin film substrates, the electrical series connection between cells may be constructed differently for a thin film cell than for a crystalline cell, and forming reliable series connections between thin film cells poses several challenges. For example, soldering (the traditional technique used to connect crystalline solar cells) directly on thin film cells exposes the PV coatings of the cells to damaging temperatures, and the organic-based silver inks typically used to form a collection grid on thin film cells may not allow strong adherence by ordinary solder materials in any case. Thus, PV cells often are joined with stand-alone wires or conductive tabs attached to the cells with an electrically conductive adhesive (ECA), rather than by soldering.

However, even when stand-alone wires or tabs are used to form inter-cell connections, the extremely thin coatings and potential flaking along cut PV cell edges introduces opportunities for shorting (power loss) wherever a wire or tab crosses over a cell edge. Furthermore, the conductive substrate on which the PV coatings are deposited, which typically is a metal foil, may be easily deformed by thermo-mechanical stress from attached wires and tabs. This stress can be transferred to weakly-adhering interfaces, which can result in delamination of the cells.

In addition, adhesion between the ECA and the cell back side, or between the ECA and the conductive grid on the front side, can be weak, and mechanical stress may cause separation of the collection grid at these locations. Also, corrosion can occur between the molybdenum or other coating on the back side of a cell and the ECA that joins a tab of the collection grid to the solar cell there. This corrosion may result in a high-resistance contact or adhesion failure, leading to power losses.

Advanced methods of joining thin film PV cells with conductive tabs or ribbons may largely overcome the problems of electrical shorting and delamination, but may require undesirably high production costs to do so. Furthermore, all such methods—no matter how robust—require that at least some portion of the PV string be covered by a conductive tab, which blocks solar radiation from striking that portion of the string and thus reduces the efficiency of the system. As a result, there is a need for improved methods of interconnecting PV cells into strings, and for improved strings of interconnected cells. Specifically, there is a need for strings and methods of their formation that reduce interconnection costs and reduce the fraction of each PV cell that is covered by the interconnection mechanism, while maintaining or improving the ability of the cell to withstand stress.

ICI (Integrated Cell Interconnect) technology overcomes the above problem, but presently relies upon a Cu grid collection structure formed in a subtractive process. Cu foil formed by electrodeposition is laminated on a polymer web, and more than 90% of the Cu mass is subsequently removed. The relative area of Cu removed is even greater. While a portion of the Cu that is removed can be reclaimed, the process is relatively costly and inefficient, and only a few suppliers worldwide are capable of supplying the flexible interconnect structure produced in this manner. Furthermore, the reclaimed Cu must be refined and reprocessed for applications requiring particular levels of purity.

In addition, the plating and subtractive etching process associated with the formation of current grid structures utilizes strong chemical baths that can adulterate the substrate (affecting solar module performance or reliability), or place constraints on suitable substrate materials.

For all of the above reasons, there is a need for improved apparatus and methods for forming conductive grid patterns on flexible substrates such as transparent polymer sheets.

SUMMARY

The present disclosure provides systems, apparatuses, and methods relating to conductive grid formation on polymer sheets. In some embodiments, a method of forming a conductive metal grid on a transparent polymer sheet may include applying an electrically insulating coating to an electrically conductive cylinder, wherein the coating is patterned to expose portions of a conductive surface of the cylinder corresponding to a grid pattern to be formed; at least partially immersing the cylinder into a metal-containing solution; applying electrical current to the conductive cylinder, thereby causing electrodeposition of metal onto the exposed portions of the conductive surface and forming a conductive metal grid on the cylinder; rotating the cylinder until the conductive grid comes into contact with a transparent polymer sheet wrapped around a portion of the cylinder; and separating the sheet from the cylinder with the conductive grid attached to the sheet.

In some embodiments, a method of forming a conductive collection grid for a photovoltaic module may include applying an electrically insulating coating to a drum having an electrically conductive surface; patterning the electrically insulating coating to expose areas of the conductive surface of the drum corresponding to a grid pattern; electrodepositing a metal onto the exposed areas of the conductive surface to form a metallic collection grid attached to the conductive surface; contacting the collection grid with a transparent polymer sheet while the collection grid is attached to the conductive surface, thereby causing the collection grid to adhere to the polymer sheet; and separating the transparent polymer sheet from the drum with the grid pattern attached to the polymer sheet.

In some embodiments, a method of forming a conductive grid on a transparent flexible sheet, comprising: providing an electrically conductive surface partially covered with an electrically insulating coating, wherein an uncovered portion of the conductive surface corresponds to a grid pattern; electrodepositing a conductive material onto the uncovered portion of the conductive surface to form a conductive grid attached to the conductive surface; contacting the electrically insulating coating and the conductive grid with a transparent flexible sheet; and separating the transparent flexible sheet from the electrically insulating coating with the conductive grid attached to the transparent flexible sheet.

In some embodiments, a high-rate, low cost additive method of forming a conductive metallic grid of arbitrary complexity on a transparent adhesive polymer sheet may include using an electrically insulating, non-stick coating on a metallic cylinder, said insulating coating first patterned to expose the conductive surface of the metallic cylinder in preselected areas; at least partially immersing the cylinder in a chemical solution wherein a conductive metal is electrodeposited into the features patterned in the insulating layer; pulling off the electrodeposited metallic grid electrodeposited into the areas patterned to expose the conductive metallic cylinder onto an adhesive polymer sheet as the adhesive polymer sheet is wrapped around a portion of the outer circumference of said cylinder; and separating the polymer sheet from the cylinder, creating a formed metallic grid adherent to the adhesive polymer sheet.

Features, functions, and advantages may be achieved independently in various embodiments of the present disclosure, or may be combined in yet other embodiments, further details of which can be seen with reference to the following description and drawings.

DESCRIPTION

Overview

Various embodiments of a system for additively forming a conductive grid on a transparent adhesive polymer sheet (or any other suitable polymer sheet), as well as related methods, are described below and illustrated in the associated drawings. Unless otherwise specified, a grid formation system and/or its various components may, but are not required to, contain at least one of the structure, components, functionality, and/or variations described, illustrated, and/or incorporated herein. Furthermore, the process steps, structures, components, functionalities, and/or variations described, illustrated, and/or incorporated herein in connection with the present teachings may, but are not required to, be included in other similar grid formation systems. The following description of various embodiments is merely exemplary in nature and is in no way intended to limit the disclosure, its application, or uses. Additionally, the advantages provided by the embodiments, as described below, are illustrative in nature and not all embodiments provide the same advantages or the same degree of advantages.

Grid formations systems disclosed herein overcome several disadvantages inherent in typical grid formation techniques. For example, existing Cu deposition and subtractive etching methods result in high percentages of unrecoverable waste and potential substrate adulteration. In contrast, additive grid formation methods described herein result in low or negligible waste, and do not subject the substrate (i.e., the polymer sheet) to potentially harmful chemical baths.

In general, an additive grid formation system may include a rotatable drum having an electrically conductive outer surface coated with a non-stick, insulating layer, e.g., polytetrafluoroethylene (PTFE). A grid pattern may be formed in the insulating layer, such that the underlying conductive surface is exposed where the grid pattern exists. The drum may be partially submerged in a chemical bath containing a conductive metal (e.g., copper ions), with the axis of the drum being substantially parallel to the surface of the bath. A lower portion of the drum may be submerged, while an upper portion remains out of the bath, such that rotation of the drum causes the patterned outer surface of the drum to pass into and subsequently out of the bath.

An electrical current may be applied, resulting in electrodeposition of the Cu (or other conductive metal) onto the submerged portion of the drum. However, as the surface other than the grid pattern is covered in an insulating material, Cu is deposited only onto the exposed grid pattern.

A transparent polymer sheet, which may have an adhesive surface, may be placed into contact with an unsubmerged portion of the rotating drum. The sheet may come into contact with the drum after the drum surface exits the bath, and wrap around an unsubmerged portion of the drum. The sheet may then be removed from the drum surface prior to its reentry into the bath. Pressure and/or heat may be applied, such that the sheet is laminated onto the surface of the drum, and then peeled off upon exit. This lamination and subsequent separation results in the Cu grid being attached to the polymer sheet and removed from the drum surface. An electrically conductive coating may be added to the exposed grid pattern of the drum, such that the coating functions as a release layer to facilitate the grid preferentially attaching to the polymer sheet.

The polymer sheet may comprise a roll or spool of polymer sheet material, or another substantially continuous source of polymer sheeting. Accordingly, the polymer sheet may be continuously fed onto and off of the drum as the drum is rotated into and out of the chemical bath, such that a continuous polymer sheet having an electrically conductive grid is produced by the system. The system may comprise a roll-to-roll system, such that the metalized sheet is spooled onto a receiving roll.

Examples, Components, and Alternatives

The following sections describe selected aspects of exemplary grid formation systems as well as related systems and/or methods. The examples in these sections are intended for illustration and should not be interpreted as limiting the entire scope of the present disclosure. Each section may include one or more distinct inventions, and/or contextual or related information, function, and/or structure.

Illustrative Apparatus

Figure 1:
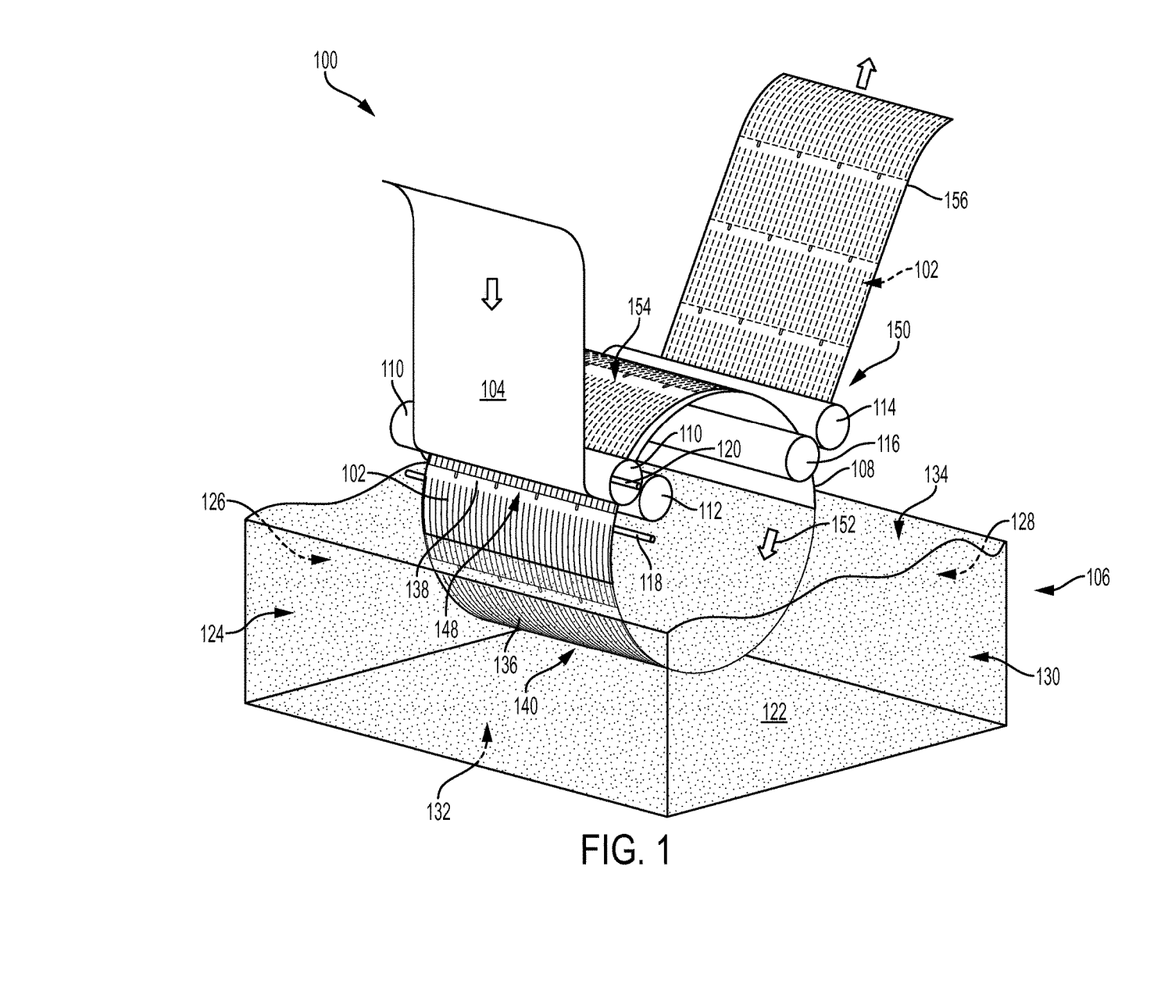
FIG. 1 is an isometric view of an illustrative apparatus for forming a conductive grid on a transparent polymer sheet.
Figure 2:
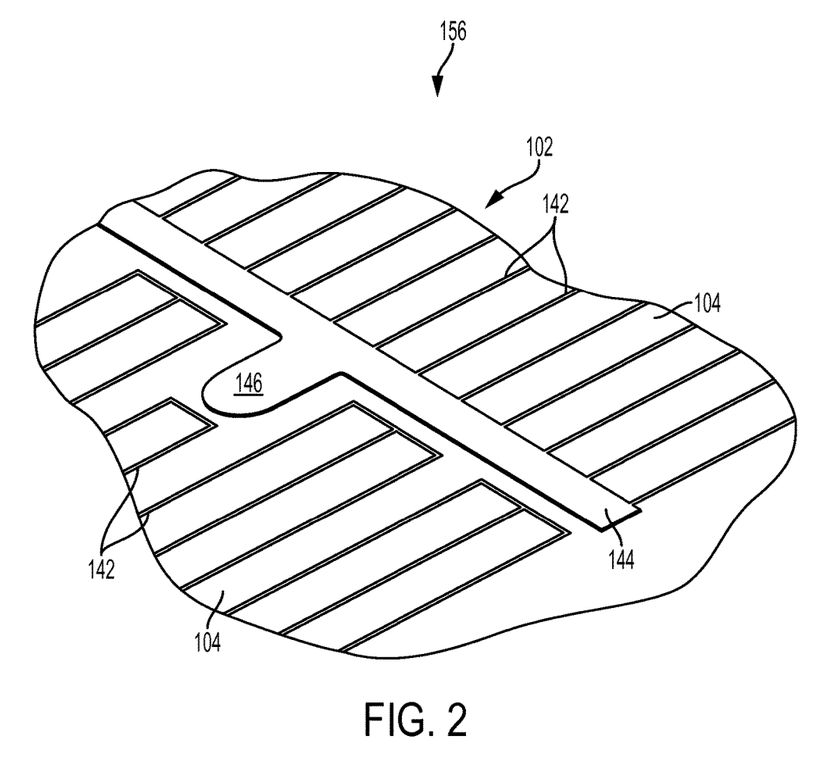
FIG. 2 is a magnified partial view of an illustrative conductive grid pattern formed on a transparent polymer sheet in accordance with aspects of the present disclosure.

As shown in FIGS. 1-2, this section of the present disclosure relates to an illustrative apparatus that may be used to form a conductive metal grid on a transparent polymer sheet.

FIG. 1 depicts an example of a grid formation apparatus, generally indicated at 100, for forming a conductive metal grid 102 on a transparent polymer sheet 104. Apparatus 100 includes a bath container 106, an electrically conductive cylinder 108, compressing elements 110, 112, 114, 116 disposed on portions of cylinder 108, and heaters 118 and 120. Heater 118 is disposed inside cylinder 108 in the vicinity of compressing elements 110 and 112. Heater 120 is disposed inside compressing element 110.

Bath container 106 is configured to contain a metal-containing electrodeposit solution 122, and may include any suitable structures and components configured to receive cylinder 108 at least partially into the solution. For instance, the bath container may include walls 124, 126, 128, 130 and a floor 132 configured to contain electrodeposit solution 122. Bath container 106 forms an open surface, generally indicated at 134, configured to receive electrically conductive cylinder 108. Bath container 106 may comprise any electrically neutral material. For instance, bath container 106 may be made of plastic. In some cases (not shown), the entirety of apparatus 100 may be enclosed.

Electrodeposit solution 122, also referred to as a metal-containing solution, may have any suitable composition configured to transport an electrodepositable ion or a combination of electrodepositable ions. For example, electrodeposit solution 122 may be an aqueous solution containing copper ions, copper ions plus some other metallic ion such as nickel or chromium, or any other suitable metallic ion or combination of ions. The ions in solution 122 will generally be provided from one or more sources of material (not shown) which are immersed in the solution and which function as an electrical anode, as is well known in the art of electrodeposition.

Electrically conductive cylinder 108, which also may be referred to as a drum, a barrel, and/or a mandrel, may include any suitable structures and components configured to conduct an applied electrical current and to rotate about an axis. For instance, electrically conductive cylinder 108 may be a stainless steel or aluminum cylinder having a conductive surface 136. Cylinder 108 may be configured to rotate partially within solution 122, as shown in FIG. 1. The electrically conductive cylinder has an electrically insulating coating 138 that is patterned to expose portions of conductive surface 136. In some cases, cylinder 108 may be hollow, as depicted in FIG. 1, whereas in other cases the cylinder may be substantially solid or partially solid in its interior. In some examples, cylinder 108 may rotate about a central axle (not shown). In some cases, rotation of cylinder 108 may be driven by the motion of polymer sheet 104. In other cases, cylinder 108 may be rotated in some other manner, such as by rotation of a central axle which is rigidly attached to the cylinder.

Electrically insulating coating 138 may include any suitable structures and components configured to provide electrical insulation, inertness to the electrodeposition chemistry, adhesion to cylinder 108, non-adhesion or low-adhesion to transparent polymer sheet 104 under lamination conditions, and resistance to lamination temperatures (around 160° C.). For example, the electrically insulating coating may be made of fluoropolymer, chlorofluoropolymer, or any other suitable thermosetting or thermoplastic polymer. In some examples, electrically insulating coating 138 may comprise PTFE. The coating may have any desired thickness approximately corresponding to the desired thickness of a conductive grid to be created. The coating thickness may be chosen to control the thickness of the grid, as measured radially with respect to the cylinder. For example, the coating may be less than about 50 micrometers (i.e., microns) thick, and in some cases the coating may be approximately 25 to approximately 30 microns thick.

Patterning of the electrically insulating coating can be accomplished, for example, via laser, which is used to selectively remove the insulating coating down to the underlying conductive surface. A resulting pattern, generally indicated at 140, may include lines and interconnection regions with various dimensions. Any arbitrary pattern may be formed, resulting in great flexibility of design. In some examples, pattern 140 may correspond to a desired conductive grid 102 configured to electrically interconnect pairs of adjacent photovoltaic (PV) cells. For instance, pattern 140 may include fine parallel longitudinal lines, thicker transverse lines, and interconnection regions, respectively forming the shapes of grid lines 142, bus bars 144, and interconnection regions 146 of grid 102, described further below with respect to FIG. 2.

Compressing elements 110, 112, 114, 116 are configured to guide and compress a transparent polymer sheet, such as sheet 104, against cylinder 108. For example, compressing elements 110, 112, 114, 116 may include nip rolls or pinch rolls (or rollers), and may be smaller, paired cylinders arranged adjacent to cylinder 108. In the example depicted in FIG. 1, a first pair of pinch rolls 110 and 112 is disposed on opposite sides of (i.e., above and below) conductive surface 136, at the desired position where sheet 104 is to contact surface 136. In other words, one compressing element (110) may be exterior to cylinder 108, and the other compressing element (112) may be interior to the cylinder. Similarly, a second pair of pinch rolls 114 and 116 is disposed on opposite sides of surface 136 downstream of the first pair, at a desired position where sheet 104 is to separate from contact surface 136. Accordingly, sheet 104 wraps around a portion of cylinder 108 between the two pairs of rolls. In some examples, the weight of cylinder 108 may be supported by lower compressing elements 112 and 116, and/or rotation of cylinder 108 may be driven by the compressing elements, rotation of which may in turn be driven in some cases by motion of sheet 104. In some examples, one or both interior rolls may be absent, such as when cylinder 108 is supported on a central axle and pressure is applied from exterior rolls to achieve lamination.

As indicated above, a first space between compressing element 110 and conductive surface 136 forms an entry 148 for transparent sheet 104, while a second space between compressing element 114 and conductive surface 136 forms an exit 150 for transparent sheet 104. Rotation of cylinder 106, generally indicated at 152, will result in rotation of compressing elements 110-116 (or, in some examples, vice versa) causing sheet 104 to be compressed against cylinder 106 at entry 148. This rotation also allows sheet 104 to be lifted away from cylinder 106 at exit 150. In conjunction with compression produced by the nip rolls, the application of suitable tension to the polymer sheet will cause the sheet to remain compressed against the cylinder in an intermediate region 154 between the entry point and the exit point.

In addition to pressure from the compressing elements, lamination of sheet 104 onto the drum may be aided by an adhesive layer on sheet 104 (and/or on cylinder 108), and/or by application of heat. In some examples, heat is applied without additional adhesive. In some examples, an adhesive is used to facilitate transfer of the conductive grid onto the polymer sheet. For example, a thermoplastic adhesive may be used, which may be activated by heating. One or more heaters may be utilized for any of these purposes. Such heaters may include any suitable device(s) configured to generate lamination temperatures with respect to transparent polymer sheet 104. For example, first heater 120 may be disposed interior to compression element 110, and second heater 118 may be disposed interior to cylinder 108. Heaters 118 and 120 may include induction heater elements and/or resistive elements used to generate temperatures around 160° C. In general, heaters 118 and 120 may be used to raise the temperatures of the polymer sheet, the exterior nip roll and/or the main cylinder in the vicinity of entry point 148.

As shown in FIG. 1, metal grid 102 is formed on cylinder 108 and sticks to, adheres to, and/or is laminated onto sheet 104 in intermediate region 154. The grid is then removed from cylinder 108 as sheet 104 is peeled off the drum at or near exit 150. A release layer or release surface may be applied to the exposed conductive surfaces of pattern 140 to facilitate release of the grid material from the drum. For example, this release layer may include electroplated chromium, nickel-teflon, chromium-polymer, and/or other similar conductive layers that may be applied selectively to the exposed conductive mandrel surfaces.

The combination of metal grid 102 and sheet 104 forms a flexible metalized sheet 156, which is then usable, e.g., for further PV manufacturing, such as in flexible PV panels. Metalized sheet 156 may be referred to as a metalized polymer sheet and/or a conductive grid laminate or grid layer.

Turning to FIG. 2, a magnified partial view of metalized sheet 156 is depicted, illustrating possible details of a grid pattern that may be formed on a polymer sheet according to aspects of the present teachings. Here, grid 102 is shown on polymer sheet 104 to include grid lines 142, bus bars 144, and interconnection regions 146. More generally, any suitable metalized grid pattern may be formed on a flexible substrate using the methods and apparatus of the present teachings.

Transparent polymer sheet 104 is configured to provide selective adhesion, flexibility, and resistance to lamination temperatures. For example, when transparent polymer sheet 104 is heated by heaters 118 and 120, the sheet may adhere to metal grid 102 newly formed on cylinder 106 but not to electrically insulating coating 138. Transparent polymer sheet 104 may be made of a thermoplastic polymer such as thermoplastic polyolefin/polyethylene terephthalate (TPO/PET) or the like.

Grid 102 is composed of electrodeposited metal, forming grid lines 142, bus bars 144, and interconnection regions 146. The grid geometry shown in FIG. 2 is merely illustrative and should not be considered limiting. Grid lines, bus bars and interconnection regions may have different dimensions corresponding to a desired grid configured to electrically interconnect adjacent photovoltaic cells of a particular type, or in some cases simply to collect electric current generated by a single cell.

In the embodiment of FIG. 2, grid lines 142 are fine parallel lines extending longitudinally in rectangular loops from bus bar 144. Grid lines 142 typically have a width below about 200 microns and a thickness below about 50 microns.

Bus bar 144 interconnects grid lines 142. Bus bar 144 has a width substantially greater than width of the grid lines, and like the grid lines typically has a thickness below 50 microns. The size of the grid pattern may be varied as needed, for example to accommodate different PV cell dimensions.

Interconnection regions 146 include transverse extensions of bus bar 144. In the embodiment of FIG. 2, region 146 is configured to extend beyond the boundary of a first PV cell contacted by the corresponding bus bar, to make contact with a portion of an adjacent, second PV cell. By appropriately electrically isolating these portions of the adjacent cell, and causing interconnection regions 146 to make electrical contact with a back contact of the adjacent cell, grid 102 can be used to electrically interconnect adjacent cells in series. The grid lines, the bus bars, and the interconnection regions will generally have the same thickness of electrodeposited metal, which as mentioned previously is typically less than 50 microns and may correspond to a thickness of coating layer 138.

Illustrative Methods

Figure 3:
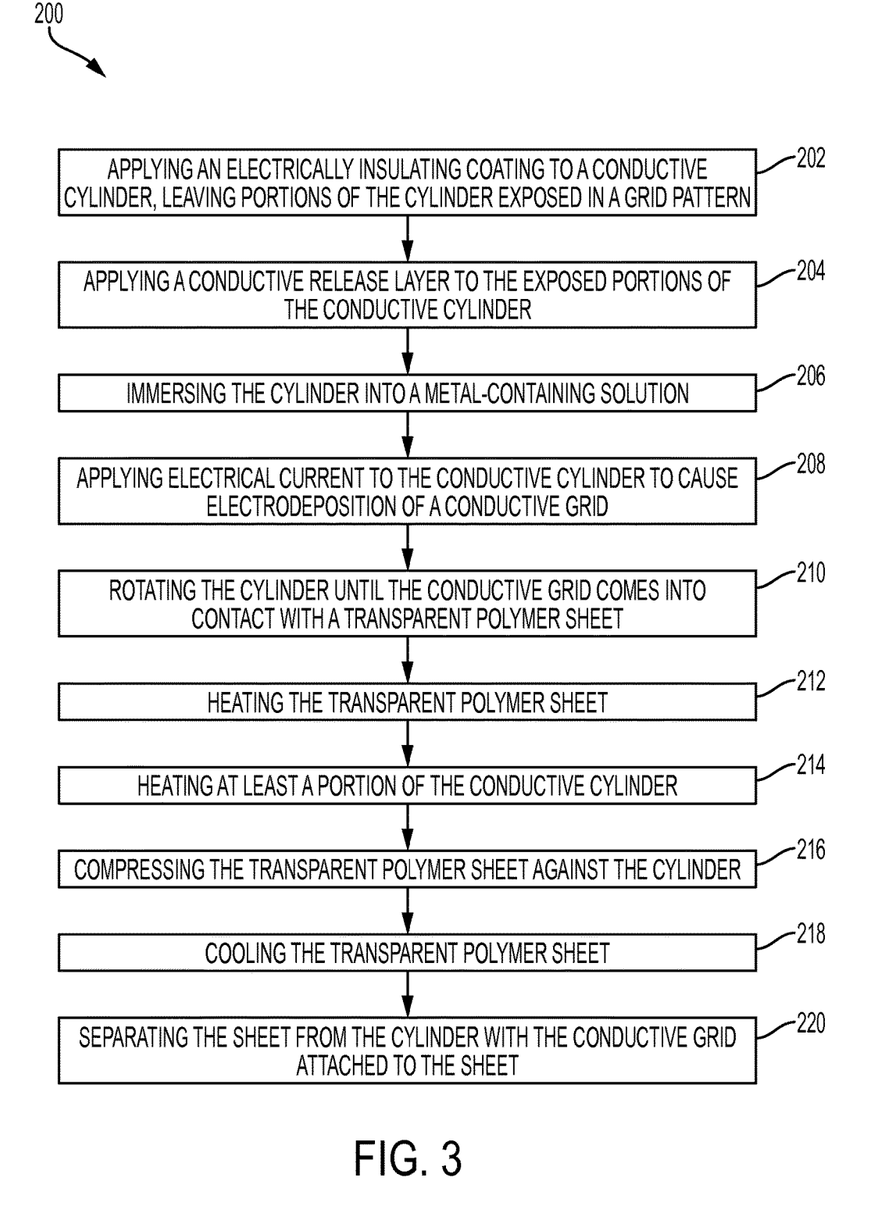
FIG. 3 is a flow chart depicting steps performed in an illustrative method of forming a conductive metal grid on a transparent polymer sheet.
Figure 4:
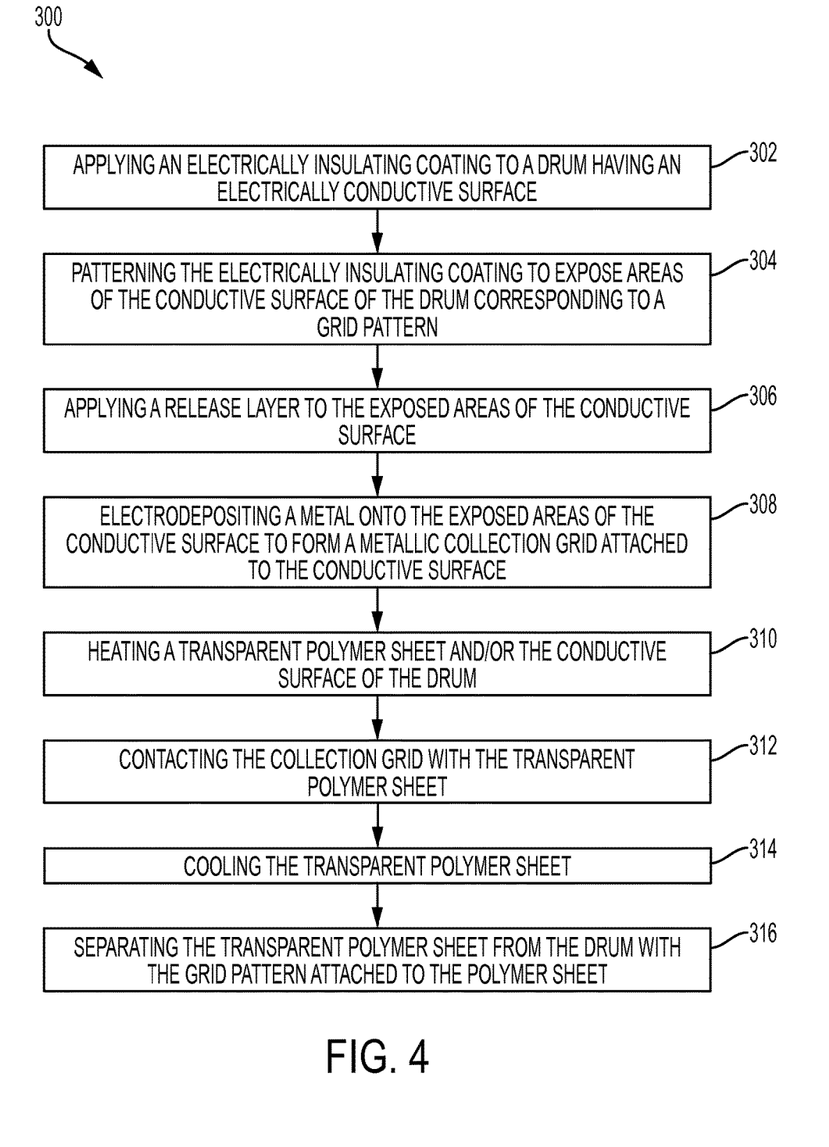
FIG. 4 is a flow chart depicting steps performed in an illustrative method of forming a conductive collection grid for a photovoltaic module.
Figure 5:
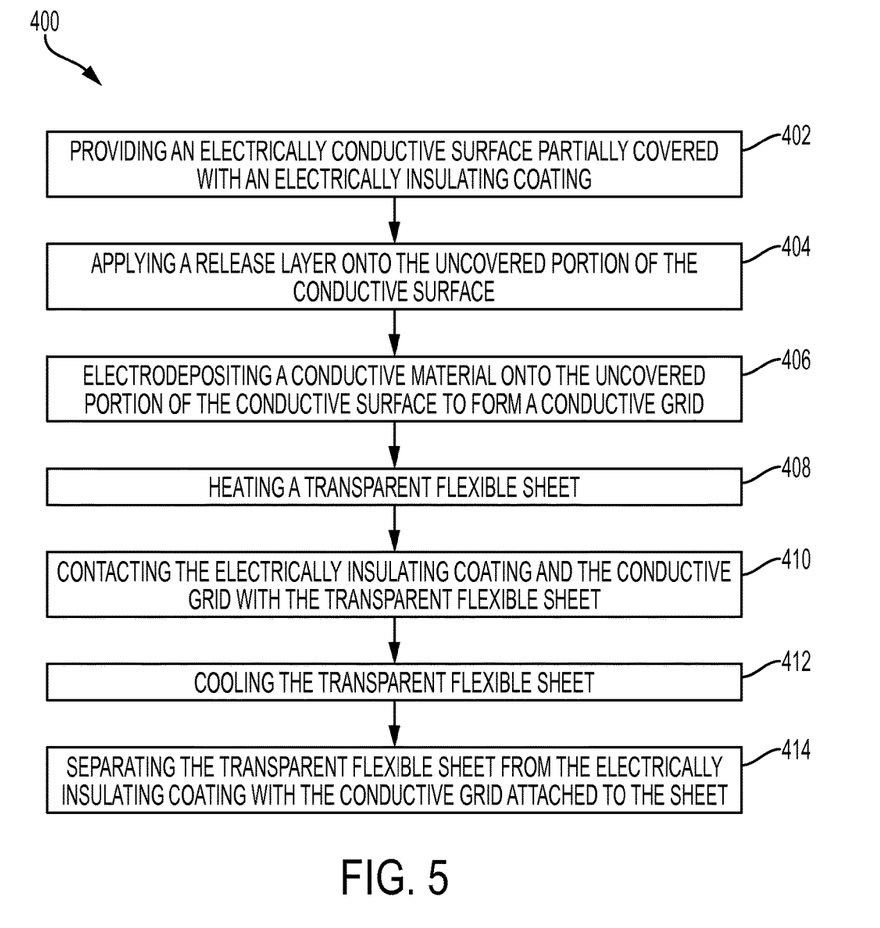
FIG. 5 is a flow chart depicting steps performed in an illustrative method of forming a conductive grid on a transparent flexible sheet.

This section describes steps performed in various methods for forming metalized grids on polymer sheets; see FIGS. 3-5. Aspects of grid formation apparatus 100 may be utilized in the method steps described below. Where appropriate, reference may be made to previously described components and systems that may be used in carrying out each step. These references are for illustration, and are not intended to limit the possible ways of carrying out any particular step of the method.

FIG. 3 is a flowchart illustrating operations performed in an illustrative method, and may not recite the complete process or all steps of the method. FIG. 3 depicts multiple steps of a method, generally indicated at 200, which may be performed in conjunction with grid formation systems in accordance with aspects of the present disclosure. Although various steps of method 200 are described below and depicted in FIG. 3, the steps need not necessarily all be performed, and in some cases may be performed in a different order than the order shown.

Step 202 includes applying an electrically insulating coating to a conductive cylinder, leaving portions of the cylinder exposed in a grid pattern. For example, an insulating coating such as PTFE may be applied to a conductive drum, with a grid pattern formed in the coating to expose the conductive drum underneath. The grid pattern may be configured as one or more electrical circuits for PV cells. The grid pattern in the coating may be formed, for example, by laser etching the pattern after the coating has been applied to the drum. In other cases, the grid pattern may be formed by chemically or physically masking the conductive drum before applying the insulating coating, followed by removal of the masking agent.

Step 204 includes applying a conductive release layer to the exposed portions of the conductive cylinder. For example, the portions that are exposed, i.e., the grid pattern in the coating, may have a releasing material applied. Accordingly, metal will be deposited (see step 208) into the grid pattern, but the metal will be less likely to remain adhered or otherwise attached to the exposed conductive portions of the cylinder when contacted by a polymer sheet. Suitable release materials include chromium, nickel-teflon, chromium-polymer, and/or the like, which may be applied, for example, by electrodeposition. The release layer is applied as a thin coating, leaving an etched pattern having a depth similar to the desired thickness of the grid pattern to be formed and eventually applied to a flexible sheet.

Step 206 includes at least partially immersing the cylinder into a metal-containing solution. For example, the cylinder may be partially immersed in a radial direction, such that the entire length of the cylinder is submerged, but not the entire diameter. Although the drum of the apparatus is described here as a cylinder, any suitable shape may be used. The cylinder may remain so immersed during subsequent steps.

Step 208 includes applying electrical current to the conductive cylinder to cause electrodeposition of a conductive grid. Any suitable electrodeposition method may be used, such that a metal in the metal-containing solution is deposited into the grid pattern of the cylinder, thereby forming the conductive grid.

Step 210 includes rotating the cylinder until the conductive grid comes into contact with a transparent polymer sheet. Rotation of the cylinder may be achieved by any suitable method or device. For example, a motorized drive unit may be used to rotate the cylinder directly, e.g., at a selected rotational speed. In other cases, the polymer sheet may be transported, for instance by a reel-to-reel system, and friction between the polymer sheet and the cylinder may cause the cylinder to rotate at a rate set by the movement of the sheet.

Step 212 includes heating the transparent polymer sheet. The polymer sheet may be heated directly or indirectly. For example, a roller or other component may be heated and placed into contact with the sheet, whereby heat is transferred to the sheet.

In other cases, the sheet may be heated directly, with a dedicated heater, before or after it makes contact with the conductive cylinder.

Step 214 includes heating at least a portion of the conductive cylinder. For example, the conductive cylinder may be heated in a region of the cylinder adjacent to the location where the conductive grid comes into contact with the polymer sheet. Any suitable heating mechanism may be used to heat the cylinder. For example, an inductive heating element may be disposed in a fixed location near the cylinder, adjacent or in close proximity to the outer surface.

Step 216 includes compressing the transparent polymer sheet against the cylinder. Compression may be accomplished by any suitable mechanism. For example, a pair of nip rolls or pinch rollers may be utilized, with one roll on an exterior surface of the sheet and the opposing roll on an interior surface of the cylinder. In some examples, only an exterior roller may be used to apply compression, wherein the cylinder itself provides opposing pressure. Compression is performed in this step to laminate the polymer sheet onto the outer surface of the cylinder. In general, the conductive grid will preferentially adhere to the polymer sheet rather than to the conductive cylinder. One or more adhesives may be utilized on the polymer sheet to aid this process. The adhesive may be heat activated.

Step 218 includes cooling the transparent polymer sheet. Any suitable cooling method may be used, e.g., forced air cooling, refrigeration, and/or the like. Passive (e.g., dissipation through ordinary conduction, radiation, and convection) and/or active cooling methods may be utilized. This solidifies the thermoplastic adhesive to the electrodeposited metal grid and reduces the adhesion of the polymer sheet to the portions of the conductive cylinder surrounding the grid pattern, and/or adhesion of the grid pattern to the underlying release layer.

Step 220 includes separating the sheet from the cylinder with the conductive grid attached to the sheet. Separation may be performed by urging or otherwise pulling the sheet in a direction transverse to the cylinder surface. Separation force may be supplied by powered mechanical equipment, such as a powered spindle, spooling apparatus, or conveyor. Through a proper balance of adhesion forces between the polymer sheet, the conductive grid pattern, and the cylinder, the result of the separation will be that substantially the entirety of the grid pattern will be adhered to the polymer sheet.

FIG. 4 is a flowchart illustrating operations performed in another illustrative method, and may not recite the complete process or all steps of the method. FIG. 4 depicts multiple steps of a method, generally indicated at 300, which may be performed in conjunction with grid formation systems in accordance with aspects of the present disclosure. Although various steps of method 300 are described below and depicted in FIG. 4, the steps need not necessarily all be performed, and in some cases may be performed in a different order than the order shown.

Step 302 includes applying an electrically insulating coating to a drum having an electrically conductive surface. For example, the drum may have a metal surface, such as steel or aluminum. The drum may have any suitable shape. For example, the drum may be cylindrical or tubular. In some examples, the drum may have an oval or polygonal cross section. The electrically insulating coating may have low-friction, non-stick, and/or electrically neutral characteristics. The electrically insulating coating may include any suitable material, such as PTFE.

Step 304 includes patterning the electrically insulating coating to expose areas of the conductive surface of the drum corresponding to a grid pattern. For example, the coating may be etched, masked, or otherwise formed into a grid pattern corresponding to electrical circuits for a PV cell or string of cells.

Step 306 includes applying a thin release layer coating to the exposed areas of the conductive surface. Suitable release layers may include chromium, nickel-teflon, chromium-polymer, and/or the like, which may be applied by electrodeposition or by any other suitable method. The release layer may be applied with any desired thickness. For instance, if the electrically insulating coating has a first thickness, the release layer will generally have a second thickness less than the first thickness, and the difference between the first thickness and the second thickness will be similar to a desired thickness of the conductive grid to be formed.

Step 308 includes electrodepositing a metal onto the exposed areas of the conductive surface to form a metallic collection grid attached to the conductive surface. Any suitable electrodeposition method may be used, and any suitable conductive metal. For example, a chemical bath containing copper ions may be utilized.

Step 310 includes heating a transparent polymer sheet and/or the conductive surface of the drum. Any suitable heaters may be used, as described above. Heating may be performed to facilitate the lamination of step 312, and in some cases may activate an adhesive applied to the sheet, the drum, or both.

Step 312 includes contacting the collection grid with the transparent polymer sheet. This may be achieved through a lamination process in which the polymer sheet is laminated to the grid using pressure, adhesive, and/or heat.

Step 314 includes cooling the transparent polymer sheet. As described above, any suitable method may be used, such as forced air cooling, refrigeration, and/or the like. Passive (e.g., dissipation) and/or active cooling methods may be utilized.

Step 316 includes separating the transparent polymer sheet from the drum with the grid pattern attached to the polymer sheet.

FIG. 5 is a flowchart illustrating operations performed in another illustrative method, and may not recite the complete process or all steps of the method. FIG. 5 depicts multiple steps of a method, generally indicated at 400, which may be performed in conjunction with grid formation systems in accordance with aspects of the present disclosure. Although various steps of method 400 are described below and depicted in FIG. 5, the steps need not necessarily all be performed, and in some cases may be performed in a different order than the order shown.

Step 402 includes providing an electrically conductive surface partially covered with an electrically insulating coating. The electrically conductive surface may include a surface of an electrically conductive drum. The insulating coating may include a layer of substantially inert material.

Step 404 includes applying a release layer onto the uncovered portion of the conductive surface, still leaving the formerly uncovered portion of the conductive surface at a depth below the surface of the electrically insulating coating by a desired amount. Suitable release materials include chromium, nickel-teflon, chromium-polymer, and/or the like.

Step 406 includes electrodepositing a conductive material onto the uncovered portion of the conductive surface to form a conductive grid. See discussion of suitable electrodeposition methods above.

Step 408 includes heating a transparent flexible sheet. For example, step 408 may include heating a flexible polymer sheet, e.g., using one or more heating elements and/or heated components.

Step 410 includes contacting the electrically insulating coating and the conductive grid with the transparent flexible sheet. As above, this step may include lamination of the sheet onto the coating and grid, possibly with the aid of pressure, adhesive, and/or heat.

Step 412 includes cooling the transparent flexible sheet. As described above, any suitable method may be used, such as forced air cooling, refrigeration, and/or the like. Passive (e.g., dissipation) and/or active cooling methods may be utilized.

Step 414 includes separating the transparent flexible sheet from the electrically insulating coating with the conductive grid attached to the sheet.

In another embodiment, a method of forming a conductive metal grid on a transparent polymer sheet may include applying an electrically insulating coating to an electrically conductive cylinder, wherein the coating is patterned to expose portions of a conductive surface of the cylinder corresponding to a grid pattern to be formed. The cylinder may be immersed, at least partially, into a metal-containing solution. Electrical current may be applied to the conductive cylinder, thereby causing electrodeposition of metal onto the exposed portions of the conductive surface and forming a conductive metal grid on the cylinder. The cylinder may be rotated until the conductive grid comes into contact with a transparent polymer sheet wrapped around a portion of the cylinder. The sheet may be separated from the cylinder with the conductive grid attached to the sheet.

In another embodiment, a method of forming a conductive collection grid for a photovoltaic module may include applying an electrically insulating coating to a drum having an electrically conductive surface. The electrically insulating coating may be patterned to expose areas of the conductive surface of the drum corresponding to a grid pattern. A metal may be electrodeposited onto the exposed areas of the conductive surface to form a metallic collection grid attached to the conductive surface. The collection grid may be contacted with a transparent polymer sheet while the collection grid is attached to the conductive surface, thereby causing the collection grid to adhere to the polymer sheet. The transparent polymer sheet may be separated from the drum with the grid pattern attached to the polymer sheet.

In another embodiment, a method of forming a conductive grid on a transparent flexible sheet may include providing an electrically conductive surface partially covered with an electrically insulating coating, wherein an uncovered portion of the conductive surface corresponds to a grid pattern. A conductive material may be electrodeposited onto the uncovered portion of the conductive surface to form a conductive grid attached to the conductive surface. The electrically insulating coating and the conductive grid may be contacted with a transparent flexible sheet. The transparent flexible sheet may be separated from the electrically insulating coating with the conductive grid attached to the transparent flexible sheet.

Selected Examples

This section describes additional aspects and features of grid formation systems and methods, presented without limitation as a series of paragraphs, some or all of which may be alphanumerically designated for clarity and efficiency. Each of these paragraphs can be combined with one or more other paragraphs, and/or with disclosure from elsewhere in this application, in any suitable manner. Some of the paragraphs below expressly refer to and further limit other paragraphs, providing without limitation examples of some of the suitable combinations.

A0. A method of forming a conductive metal grid on a transparent polymer sheet, comprising: applying an electrically insulating coating to an electrically conductive cylinder, wherein the coating is patterned to expose portions of a conductive surface of the cylinder corresponding to a grid pattern to be formed; at least partially immersing the cylinder into a metal-containing solution; applying electrical current to the conductive cylinder, thereby causing electrodeposition of metal onto the exposed portions of the conductive surface and forming a conductive metal grid on the cylinder; rotating the cylinder until the conductive grid comes into contact with a transparent polymer sheet wrapped around a portion of the cylinder; and separating the sheet from the cylinder with the conductive grid attached to the sheet.

A1. The method of paragraph A0, further comprising heating the transparent polymer sheet, thereby increasing adhesion between the sheet and the conductive grid.

A1a. The method of paragraph A1, further comprising adding a heat-activated adhesive to the transparent polymer sheet A2. The method of any of paragraphs A0 through A1a, further comprising heating the portion of the cylinder around which the transparent polymer sheet is wrapped, thereby increasing adhesion between the sheet and the conductive grid.

A3. The method of paragraph A2, further comprising cooling the transparent polymer sheet prior to separating the sheet from the cylinder.

A4. The method of any of paragraphs A0 through A3, further comprising compressing the transparent polymer sheet against the cylinder, thereby increasing adhesion between the sheet and the conductive grid.

A5. The method of any of paragraphs A0 through A4, wherein the electrically insulating coating is formed from a synthetic fluoropolymer.

A6. The method of paragraph A5, wherein the electrically insulating coating is formed from polytetrafluoroethylene (PTFE).

A7. The method of any of paragraphs A0 through A6, further comprising applying a conductive release layer to the exposed portions of the conductive surface of the cylinder.

B0. A method of forming a conductive collection grid for a photovoltaic module, comprising: applying an electrically insulating coating to a drum having an electrically conductive surface; patterning the electrically insulating coating to expose areas of the conductive surface of the drum corresponding to a grid pattern; electrodepositing a metal onto the exposed areas of the conductive surface to form a metallic collection grid attached to the conductive surface; contacting the collection grid with a transparent polymer sheet while the collection grid is attached to the conductive surface, thereby causing the collection grid to adhere to the polymer sheet; and separating the transparent polymer sheet from the drum with the grid pattern attached to the polymer sheet.

B1. The method of paragraph B0, wherein the electrically insulating coating is formed from polytetrafluoroethylene (PTFE).

B2. The method of any of paragraphs B0 through B1, further comprising heating at least one of the transparent polymer sheet and the conductive surface, thereby increasing adhesion between the transparent polymer sheet and the collection grid.

B3. The method of paragraph B2, further comprising cooling the transparent polymer sheet before separating the transparent polymer sheet from the drum.

B4. The method of any of paragraphs B0 through B3, further comprising applying a release layer to the exposed areas of the conductive surface.

B5. The method of paragraph B4, wherein the release layer is formed from a material chosen from the set consisting of chromium, nickel-teflon, and chromium-polymer.

C0. A method of forming a conductive grid on a transparent flexible sheet, comprising: providing an electrically conductive surface partially covered with an electrically insulating coating, wherein an uncovered portion of the conductive surface corresponds to a grid pattern; electrodepositing a conductive material onto the uncovered portion of the conductive surface to form a conductive grid attached to the conductive surface; contacting the electrically insulating coating and the conductive grid with a transparent flexible sheet; and separating the transparent flexible sheet from the electrically insulating coating with the conductive grid attached to the transparent flexible sheet.

C1. The method of paragraph C0, wherein the electrically conductive surface is cylindrical.

C2. The method of paragraph C1, wherein the electrically conductive surface is configured to rotate so that each portion of the surface enters a solution where electrodeposition occurs and then exits the solution before being contacted with the transparent flexible sheet.

C3. The method of any of paragraphs C0 through C2, further comprising heating the transparent flexible sheet to promote adhesion between the sheet and the conductive grid.

C4. The method of paragraph C3, further comprising cooling the transparent flexible sheet prior to pulling the sheet away from the electrically insulating coating.

C5. The method of any of paragraphs C0 through C4, further comprising applying a release layer onto the uncovered portion of the conductive surface, prior to electrodepositing the conductive material.

D0. A high-rate, low cost additive method of forming a conductive metallic grid of arbitrary complexity on a transparent adhesive polymer sheet may include using an electrically insulating, non-stick coating on a metallic cylinder, said insulating coating first patterned to expose the conductive surface of the metallic cylinder in preselected areas; at least partially immersing the cylinder in a chemical solution wherein a conductive metal is electrodeposited into the features patterned in the insulating layer; pulling off the electrodeposited metallic grid electrodeposited into the areas patterned to expose the conductive metallic cylinder onto an adhesive polymer sheet as the adhesive polymer sheet is wrapped around a portion of the outer circumference of said cylinder; and separating the polymer sheet from the cylinder, creating a formed metallic grid adherent to the adhesive polymer sheet.

D1. The method of paragraph D0 using copper as the metallic electrodeposited material to form the conductive grid.

D2. The method of any of paragraphs D0 through D1, using a thermoplastic adhesive for which a portion of the metallic cylinder or a part of the polymer sheet, or both, are heated to activate the adhesive properties of said thermoplastic adhesive to facilitate transferring the electrodeposited metallic features from the cylinder onto the polymer sheet.

D3. The method described in any of paragraphs D0 through D2, in which the polymer sheet is replaced by a roll of polymer web, enabling a continuous roll-to-roll process.

D4. The method of any of paragraphs D0 through D3, wherein a thin conductive coating is applied selectively in the patterned features onto the conductive cylinder as a 'release surface' that facilitates transferring the electrodeposited metallic pattern from the cylinder or mandrel onto the adhesive polymer film.

D5. The method of paragraph D4 wherein a release surface is created on the mandrel surface in the patterned features using electroplated chromium, nickel-teflon, chromium-polymer or other similar conductive layers that can be applied selectively to exposed conductive mandrel surfaces.

E0. A method of forming a conductive metallic grid of arbitrary complexity on a transparent adhesive polymer sheet by using an electrically insulating, non-stick coating on a metallic cylinder, said insulating coating first patterned to expose the conductive surface of the metallic cylinder in preselected areas, which is immersed in a chemical solution wherein a conductive metal is electrodeposited into the features patterned in the insulating layer, after which the electrodeposited metallic grid electrodeposited into the areas patterned to expose the conductive metallic cylinder is pulled off of the patterned cylinder onto an adhesive polymer sheet as the adhesive polymer sheet is wrapped around a portion of the outer circumference of said cylinder, and then separated from the cylinder, creating a formed metallic grid adherent to the adhesive polymer sheet.

Advantages, Features, Benefits

The different embodiments of the grid formation system described herein provide several advantages over known solutions for forming conductive grids on polymer sheets. For example, illustrative embodiments described herein allow Cu to be deposited in an additive process, only where needed, with very little waste. In some examples, only the Cu anode material may be consumed, resulting in indefinite use of solution chemicals.

Additionally, and among other benefits, illustrative embodiments described herein allow improved PV efficiency, due to lower resistive and optical losses.

Additionally, and among other benefits, illustrative embodiments described herein allow generation of patterns of arbitrary complexity, including bus and connection areas, with high dimensional accuracy. There may be no substantive constraints on pattern connections while forming the grid.

Additionally, and among other benefits, illustrative embodiments described herein allow a clean, simple, low-temperature, high-throughput process. The process may be roll-to-roll.

Additionally, and among other benefits, illustrative embodiments described herein allow control over the cross-sectional profile of the conductor grid elements.

Additionally, and among other benefits, illustrative embodiments described herein allow easily changed patterns simply by changing patterned drums.

No known system or device can perform these functions or combination of functions. However, not all embodiments described herein provide the same advantages or the same degree of advantage.

Conclusion

The disclosure set forth above may encompass multiple distinct examples with independent utility. Although each of these has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only. The subject matter of the invention(s) includes all novel and nonobvious combinations and subcombinations of the various elements, features, functions, and/or properties disclosed herein. The following claims particularly point out certain combinations and subcombinations regarded as novel and nonobvious. Other combinations and subcombinations of features, functions, elements, and/or properties may be claimed in applications claiming priority from this or a related application. Such claims, whether broader, narrower, equal, or different in scope to the original claims, also are regarded as included within the subject matter of the present disclosure.

What is claimed is:

1. A method of forming a conductive metal grid on a transparent polymer sheet, comprising:
   applying an electrically insulating coating to an electrically conductive cylinder, wherein the coating is patterned to expose portions of a conductive surface of the cylinder corresponding to a grid pattern to be formed;
   at least partially immersing the cylinder into a metal-containing solution;
   applying electrical current to the conductive cylinder, thereby causing electrodeposition of metal onto the exposed portions of the conductive surface and forming a conductive metal grid on the cylinder;
   rotating the cylinder until the conductive grid comes into contact with a transparent polymer sheet wrapped around a portion of the cylinder; and
   separating the sheet from the cylinder with the conductive grid attached to the sheet.

2. The method of claim 1, further comprising heating the transparent polymer sheet, thereby increasing adhesion between the sheet and the conductive grid.

3. The method of claim 2, further comprising adding a heat-activated adhesive to the transparent polymer sheet.

4. The method of claim 2, further comprising cooling the transparent polymer sheet prior to separating the sheet from the cylinder.

5. The method of claim 1, further comprising compressing the transparent polymer sheet against the cylinder, thereby increasing adhesion between the sheet and the conductive grid.

6. The method of claim 1, wherein the electrically insulating coating is formed from a synthetic fluoropolymer.

7. The method of claim 1, further comprising applying a conductive release layer to the exposed portions of the conductive surface of the cylinder.

8. A method of forming a conductive collection grid for a photovoltaic module, comprising:
   applying an electrically insulating coating to a drum having an electrically conductive surface;
   patterning the electrically insulating coating to expose areas of the conductive surface of the drum corresponding to a grid pattern;
   electrodepositing a metal onto the exposed areas of the conductive surface to form a metallic collection grid attached to the conductive surface;
   contacting the collection grid with a transparent polymer sheet while the collection grid is attached to the conductive surface, thereby causing the collection grid to adhere to the polymer sheet; and
   separating the transparent polymer sheet from the drum with the grid pattern attached to the polymer sheet.

9. The method of claim 8, further comprising heating at least one of the transparent polymer sheet and the conductive surface, thereby increasing adhesion between the transparent polymer sheet and the collection grid.

10. The method of claim 9, further comprising cooling the transparent polymer sheet before separating the transparent polymer sheet from the drum.

11. The method of claim 8, further comprising applying a release layer to the exposed areas of the conductive surface.

12. The method of claim 11, wherein the release layer is formed from a material chosen from the set consisting of chromium, nickel-teflon, and chromium-polymer.

13. The method of claim 8, wherein the electrically insulating coating is formed from a material chosen from the set consisting of polytetrafluoroethylene (PTFE), perfluoroalkoxy (PFA), fluorinated ethylene propylene (FEP) and a parylene polymer.

14. A method of forming a conductive grid on a transparent flexible sheet, comprising:
   providing an electrically conductive surface partially covered with an electrically insulating coating, wherein an uncovered portion of the conductive surface corresponds to a grid pattern;
   electrodepositing a conductive material onto the uncovered portion of the conductive surface to form a conductive grid attached to the conductive surface;
   contacting the electrically insulating coating and the conductive grid with a transparent flexible sheet; and
   separating the transparent flexible sheet from the electrically insulating coating with the conductive grid attached to the transparent flexible sheet.

15. The method of claim 14, wherein the electrically conductive surface is cylindrical.

16. The method of claim 15, wherein the electrically conductive surface is configured to rotate so that each portion of the surface enters a solution where electrodeposition occurs and then exits the solution before being contacted with the transparent flexible sheet.

17. The method of claim 14, further comprising heating the transparent flexible sheet to promote adhesion between the sheet and the conductive grid.

18. The method of claim 17, further comprising cooling the transparent flexible sheet prior to pulling the sheet away from the electrically insulating coating.

19. The method of claim 14, further comprising applying a release layer to the uncovered portion of the conductive surface, prior to electrodepositing a conductive material onto the uncovered portion of the conductive surface.

20. The method of claim 19, wherein the electrically insulating coating has a first thickness, the release layer has a second thickness less than the first thickness, and the difference between the first thickness and the second thickness corresponds to a desired thickness of the conductive grid.

* * * * *